United States Patent [19]

Hotta

[11] Patent Number: 5,394,371
[45] Date of Patent: Feb. 28, 1995

[54] SEMICONDUCTOR MEMORY DEVICE WITH SHARED SENSE AMPLIFIERS

[75] Inventor: Yasuhiro Hotta, Nara, Japan
[73] Assignee: Sharp Kabushiki Kaisha, Japan
[21] Appl. No.: 163,399
[22] Filed: Dec. 7, 1993

Related U.S. Application Data

[63] Continuation of Ser. No. 832,086, Feb. 6, 1992, abandoned.

[30] Foreign Application Priority Data

Jul. 2, 1991 [JP] Japan .................................. 3-161859

[51] Int. Cl.⁶ .............................................. G11C 17/00
[52] U.S. Cl. ........................................ 365/94; 365/103; 365/104; 365/210
[58] Field of Search ........... 365/210, 189.09, 189.07, 365/94, 103, 104, 182

[56] References Cited

U.S. PATENT DOCUMENTS

| | | | |
|---|---|---|---|
| 4,371,956 | 2/1983 | Maeda et al. | 365/210 |
| 4,654,831 | 3/1987 | Venkatesh | 365/210 |
| 4,709,352 | 11/1987 | Kitazawa | 365/104 |
| 4,758,748 | 7/1988 | Takeuchi | 365/189.09 |
| 4,819,212 | 4/1989 | Nakai et al. | 365/210 |
| 4,831,593 | 5/1989 | Kubota et al. | 365/104 |
| 4,967,395 | 10/1990 | Watanabe et al. | 365/189.07 |
| 5,117,394 | 5/1992 | Amin et al. | 365/210 |
| 5,138,579 | 8/1992 | Tatsumi et al. | 365/210 |

FOREIGN PATENT DOCUMENTS

| | | |
|---|---|---|
| 0357503 | 3/1990 | European Pat. Off. |
| 0405220 | 1/1991 | European Pat. Off. |
| 58-115690 | 7/1983 | Japan ................... 365/104 |
| 29097 | 1/1990 | Japan ................... 365/103 |

Primary Examiner—Eugene R. LaRoche
Assistant Examiner—Vu Le
Attorney, Agent, or Firm—Morrison & Foerster

[57] ABSTRACT

In a mask ROM, for each of the memory cell groups, a load circuit connected to data lines for the respective memory cell group, a sense amplifier, and a switching circuit are provided. The switching circuit selectively connects one of the data lines which are simultaneously selected, to the sense amplifier. A data line for a dummy memory cell is also connected to the sense amplifier.

8 Claims, 6 Drawing Sheets

SEMICONDUCTOR MEMORY DEVICE WITH SHARED SENSE AMPLIFIERS

This application is a continuation of application Ser. No. 07/832,086, filed Feb. 6, 1992, abandoned.

BACKGROUND OF THE INVENTION

1. Field of the Invention

The present invention relates to a semiconductor memory device, and more particularly to a semiconductor memory device having a high-speed read mode.

2. Description of the Prior Art

As the processing speed of microprocessors have been remarkably improved in recent years, a semiconductor memory device is increasingly required to operate at a high speed. Accordingly, some improved semiconductor memory devices have been developed (for example, "A 20ns 1Mb CMOS Burst Mode EPROM" by B. ASHMORE et al., 1989 IEEE International Solid-State Circuit Conference). These devices perform the normal random access more rapidly, and have a high-speed read mode. In the high-speed read mode, the read operation can be performed more rapidly, though the access methods are limited somewhat.

FIG. 5 shows a prior art mask ROM (Read Only Memory) which has such a high-speed read mode. In the mask ROM, one column select line $C_i$ is designated by decoding high order bits of an input address. Then, a plurality of transistors $Q_{i0}-Q_{in}$ in a data line selection circuit 11 are turned on, so as to select a plurality of data lines $D_{i0}-D_{in}$ corresponding thereto. Any one row select line $W_j$ is designated by decoding low order bits except for the least significant bits of the input address. One column select line $C_i$ and one row select line $W_j$ are designated, so that a plurality of memory cells 12 are simultaneously selected.

The memory cells 12 comprise transistors $Q_{ij0}-Q_{ijn}$, respectively. Each of these transistors $Q_{ij0}-Q_{ijn}$ is a MOSFET, and is formed in a semiconductor fabricating process in such a manner that the threshold voltage thereof is high when storing logical "1", and the threshold voltage becomes similar to that of the normal enhancement type when storing logical "0". Therefore, when one row select line $W_j$ is designated to become HIGH, the transistors $Q_{ij0}-Q_{ijn}$ of memory cells 12 corresponding to the column select line $W_j$ are normally off ("1") or normally on ("0"), in accordance with the logic state.

When the plurality of transistors $Q_{i0}-Q_{in}$ in the data line selection circuit 11 are turned on by the designation of the column select line $C_i$, the transistors $Q_{ij0}-Q_{ijn}$ of memory cells 12 selected by the row select line $W_j$ are connected to sense amplifiers 13, respectively. As a result, the potentials of the data lines $D_{i0}-D_{in}$ selected by the column select line $C_i$ gradually change to HIGH ("1") or LOW ("0"), respectively, in accordance with the logic states of the connected transistors $Q_{ij0}-Q_{ijn}$. These weak potentials are amplified by the respective sense amplifiers 13, in order to be valid.

In the normal random access, one of bank select lines $P_0-P_n$ is designated to be HIGH in accordance with the least significant bits of the input address. Thus, only one of transistors $Q_{p0}-Q_{pn}$ in a switching circuit 14 is turned on through which the output of the sense amplifier 13 connected to the corresponding one of data lines $D_{i0}-D_{in}$ is sent out to an output buffer 15. Therefore, in the normal random access, the logic state stored in one memory cell 12 designated by the input address can be read out via the output buffer 15.

When the logic state of memory cell 12 is read out through the corresponding one of the data lines $D_{i0}-D_{in}$ in this way, also the potentials at the remaining data lines $D_{i0}-D_{in}$ which are not selected by the switching circuit 14 have already become valid by the respective sense amplifiers 13. In this condition, when another one of the bank select lines $P_0-P_n$ is switched to be HIGH, the logic state of the corresponding memory cell 12 can be immediately read out without waiting for the potentials of the data lines $D_{i0}-D_{in}$ to be valid. Therefore, in the high-speed read mode, for example, the; least significant bits of the input address are automatically generated by an address counter, etc., so that the bank select lines $P_0-P_n$ are sequentially switched to be HIGH, whereby the transistors $Q_{p0}-Q_{pn}$ in the switching circuit 14 are sequentially turned on. Thus, the logic states of a plurality of memory cells 12 are sequentially read out through the plurality of data lines $D_{i0}-D_{in}$ simultaneously selected by one column select line $C_i$.

As shown in FIG. 6, the input address becomes valid at time $t_{10}$. In response to this, one column select line $C_i$ and one column select line $W_j$ are designated to be HIGH. Then, the data lines $D_{i0}-D_{in}$ are connected to the respective sense amplifiers 13, and the potentials of the data lines $D_{i0}-D_{in}$ change to be valid at time $t_{11}$. Since the bank select line $P_0$ has been designated to be HIGH at this time, the output of the sense amplifier 13 connected to the data line $D_{i0}$ is sent out to the output buffer 15. Next, the bank select line $P_1$ is switched to be HIGH at time $t_{12}$, and the output of the sense amplifier 13 connected to the data line $D_{i1}$ is sent out to the output buffer 15. Thereafter, the bank select lines $P_2-P_n$ are sequentially switched to be HIGH, so that the outputs of the sense amplifiers 13 connected to the corresponding data lines $D_{i2}-D_{in}$ are sent out to the output buffer 15.

As a result, the reading from the first memory cell 12 comprising the transistor $Q_{ij0}$ requires the time period of $t_{11}-t_{10}$ which continues until the potential of the data line $D_{i0}$ becomes valid, as in the normal random access. On the contrary, since the potentials of the data lines $D_{i1}-D_{in}$ simultaneously selected are already valid, the logic states of the corresponding memory cells 12 respectively comprising transistors $Q_{ij1}-Q_{ijn}$ can be immediately read out by switching the bank select lines $P_1-P_n$ in the succeeding readings.

However, in the above-mentioned prior art semiconductor memory device, it is required to provide the sense amplifiers 13 respectively on all data lines $D_{i0}-D_{in}$ which are simultaneously selected by one column select line $C_i$, in order to set a high-speed read mode. Therefore, as the number of bits which can be simultaneously read out for a high speed reading increases, the number of sense amplifiers 13 must be increased. This causes the occupied area on a chip and the power consumption to increase.

Therefore, the prior art semiconductor memory device with a high-speed read mode has a problem in that if the number of bits which are simultaneously read out increases, the chip area and the power consumption increase.

SUMMARY OF THE INVENTION

The semiconductor memory device of this invention, which overcomes the above-discussed and numerous other disadvantages and deficiencies of the prior art, comprises memory cells arranged in a matrix, row select lines and column select lines, memory cell groups each comprising two or more of said memory cells are simultaneously selected by designating one of said row select lines and one of said column select lines, and further comprises for each of groups of said memory cells: a load circuit connected to data lines for said memory cell group; a sense amplifier; and a switching circuit for selectively connecting one of said data lines which are simultaneously selected, to said sense amplifier.

In a preferred embodiment, said load circuit comprises transistors each connected to said data lines.

In a preferred embodiment, said memory cells includes at least one dummy memory cell for each of said memory cell groups.

In a preferred embodiment, a dummy data line for said dummy cell is connected to one input of said sense amplifier, and others of said data lines are connected to another input of said sense amplifier through said switching circuit.

In a preferred embodiment, an equalizing circuit is connected between said dummy data line and said data lines.

In a preferred embodiment, when an address becomes valid, said equalizing circuit connects said dummy data line with said data lines for predetermined period of time.

According to the above configuration, when a plurality of memory cells are simultaneously selected by the designation of one row select line and one column select line, the potentials of the data lines connected to these memory cells gradually change by the respective load circuits in accordance with the on/off states of the respective memory cells. After the potentials of the data lines become valid, the data lines are selectively connected to the sense amplifier by the switching circuit. Thus, for the readout of the first memory cell, it requires a time period until the potential of the data line becomes valid. However, thereafter, for the readout of the other memory cells which are simultaneously selected, since the potentials of the data lines are already valid, the readout can be immediately performed by amplifying in the sense amplifier.

Since the sense amplifier is constituted by a complicated circuit such as a differential amplifier circuit, the sense amplifier occupies a large area on a chip and the power consumption is large. On the other hand, the load circuit has a simple configuration in which, for example, one transistor is provided for each data line, so that the occupied area and the power consumption are small. According to the semiconductor memory device of the invention, a sense amplifier with a complicated configuration can be commonly used for a plurality of data lines, only by providing simple load circuits. Therefore, the chip area and the power consumption can be reduced while the high-speed read mode is provided as in the prior art.

Thus, the invention described herein makes possible the objectives of:

(1) providing a semiconductor memory device with a high speed read mode which can be manufactured in reduced size; and (2) providing a semiconductor memory device with a high speed read mode which can operate at a reduced power consumption.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
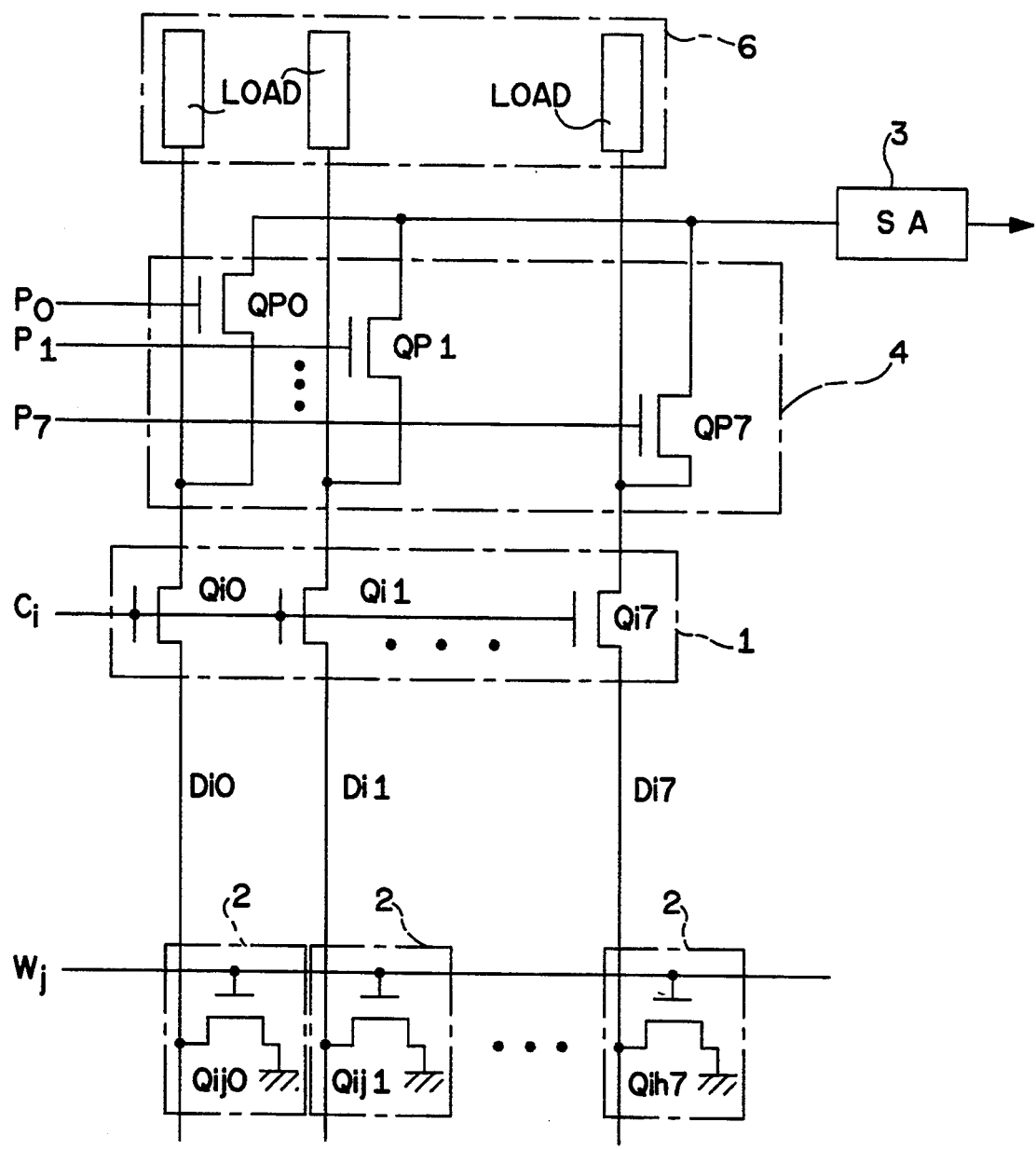
FIG. 1 is a block diagram showing the schematic configuration of a mask ROM according to the invention.

FIG. 1 shows a mask ROM according to the invention. As shown in FIG. 1, in a mask ROM of this embodiment, memory cells 2 are respectively connected to the crossings of eight data lines $D_{i0}$–$D_{i7}$ and one column select line $W_j$. These data lines $D_{i0}$–$D_{i7}$ are connected to a sense amplifier 3 via a data line selection circuit 1 and a switching circuit 4. These data lines $D_{i0}$–$D_{i7}$ are also connected to a load circuit 6 via the data line selection circuit 1.

The memory cells 2 comprises transistors $Q_{ij0}$–$Q_{ij7}$, respectively. When the row select line $W_j$ becomes HIGH, the transistors $Q_{ij0}$–$Q_{ij7}$ of memory cells 2 are turned off ("1") or on ("0") in accordance with the logic state previously established in the semiconductor fabrication process. The data line selection circuit 1 comprises transistors $Q_{i0}$–$Q_{i7}$. When the row select line $C_i$ becomes HIGH, all the transistors $Q_{i0}$–$Q_{i7}$ are turned on. In the switching circuit 4, when one of bank select lines $P_0$–$P_7$ becomes HIGH, the corresponding one of transistors $Q_{p0}$–$Q_{p7}$ is turned on, so as to selectively connect the corresponding one of the data lines $D_{i0}$–$D_{i7}$ with the sense amplifier 3.

The eight data lines $D_{i0}$–$D_{i7}$ shown in FIG. 1 constitute one set, and a plurality of such sets are provided, though not shown in the figure. Corresponding to these sets, column select lines $C_i$ and data line selection circuits 1 other than those shown in FIG. 1 are provided, respectively. When any one column select line $C_i$ is designated by decoding high order bits of an input address, one set of data lines $D_{i0}$–$D_{i7}$ is conducted and selected by the corresponding data line selection circuit 1.

A plurality of row select lines $W_j$ are provided other than that shown in FIG. 1. When one of the row select lines $W_j$ is designated by decoding low order bits except for the least significant bits of the input address, the transistors of the memory cells 2 connected to the respective crossings of the corresponding row select line $W_j$ and each of the data lines $D_{i0}$–$D_{i7}$ are turned on/off for selection. Although not shown, a number of memory cells 2 are arranged at the crossings of the respective data lines $D_{i0}$–$D_{i7}$ and the row select lines $W_j$ in a two-dimensional matrix.

A plurality of switching circuits 4 and sense amplifiers 3 are provided for the respective sets of data lines $D_{i0}$–$D_{i7}$. When one of the bank select lines $P_0$–$P_7$ is designated by decoding the least significant bits of the low order bits of the input address, the corresponding one of the data lines $D_{i0}-D_{i7}$ is connected to the corresponding sense amplifier 3, as described above.

Figure 2:
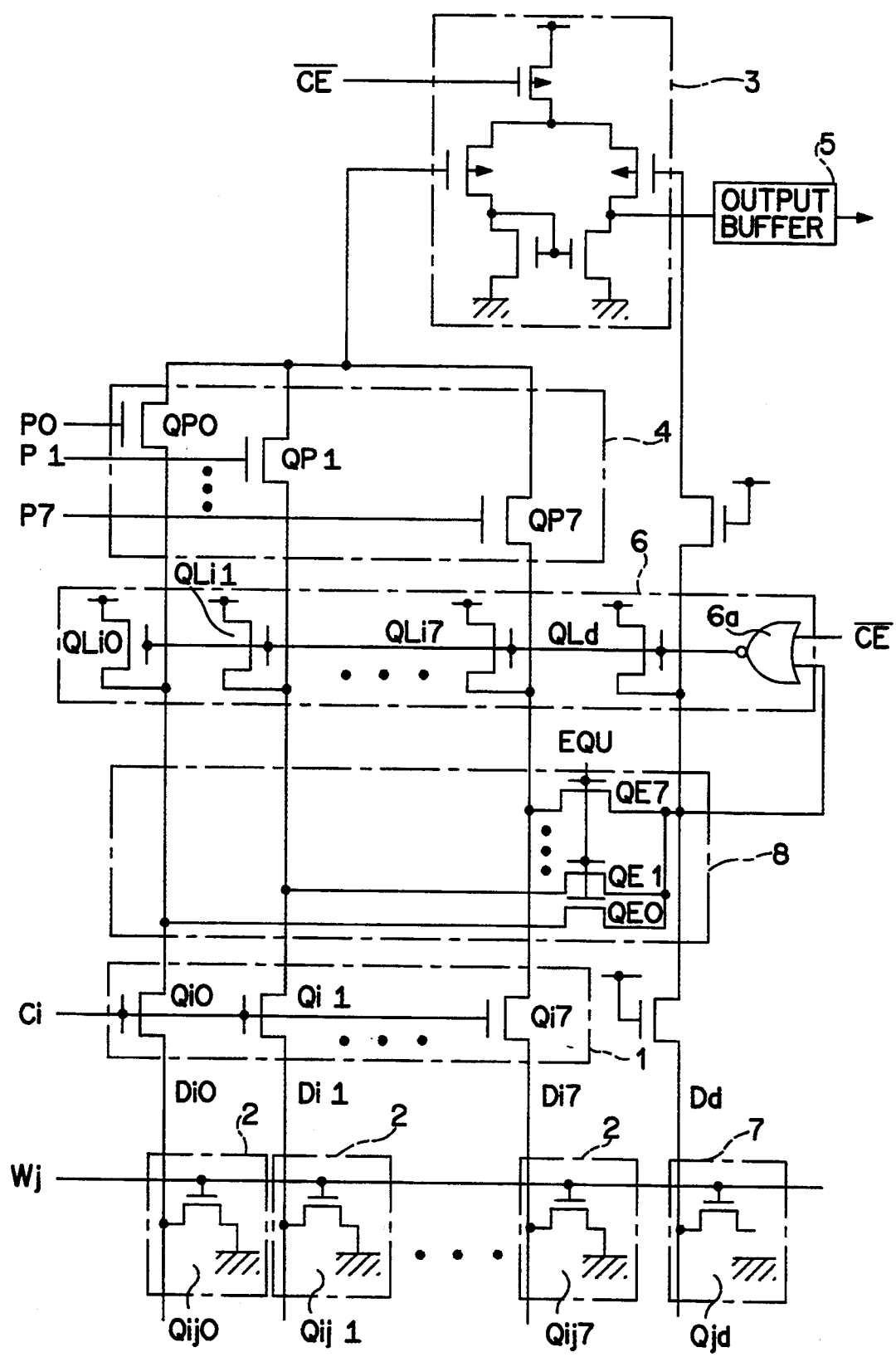
FIG. 2 is a block diagram showing the configuration of the embodiment of FIG. 1 in more detail.

As shown in FIG. 2, a differential amplifier circuit comprising MOSFETs constitutes the sense amplifier 3. One of the data lines $D_{i0}-D_{i7}$ connected by the switching circuit 4 is coupled to one input of the sense amplifier 3. To the other input of the sense amplifier 3, is coupled a dummy data line $D_d$ (which is omitted in FIG. 1). The dummy data line $D_d$ is connected to a dummy cell 7 provided at the crossing of the row select line $W_j$ and the dummy data line $D_d$, and functions as a reference circuit for the sense amplifier 3. The dummy cell 7 comprises a transistor $Q_{jd}$ which has the same characteristics as those of a transistor in the memory cell 2 storing a logic state of "0". The dummy data line $D_d$ is connected to the respective data lines $D_{i0}-D_{i7}$ via an equalizing circuit 8. The equalizing circuit 8 comprises transistors $Q_{E0}-Q_{E7}$. When an equalizing signal EQU becomes HIGH, the transistors $Q_{E0}-Q_{E7}$ are turned on, so that the dummy data line $D_d$ is connected to the respective data lines $D_{i0}-D_{i7}$. The sense amplifier 3 is disconnected from the power source when a chip enable signal $\overline{CE}$ is HIGH (i.e., when not active).

The load circuit 6 comprises transistors $Q_{Li0}-Q_{Li7}$ and $Q_{Ld}$ and a NOR gate 6a. Each of the transistors $Q_{Li0}-Q_{Li7}$ and $Q_{Ld}$ is connected between the power source and the corresponding one of the data lines $D_{i0}-D_{i7}$ and dummy data line $D_d$. These transistors are in the conductive state when the output of the NOR gate 6a is HIGH. The transistor $Q_{Ld}$ is a MOSFET having the driving current characteristic which is doubled as compared with that of the other transistors $Q_{Li0}-Q_{Li7}$. One input of the NOR gate 6a is coupled to the dummy data line $D_d$. Only when the chip enable signal $\overline{CE}$ is LOW (active), the NOR gate 6a outputs the inversion of the logic level of the dummy data line $D_d$.

Figure 3:
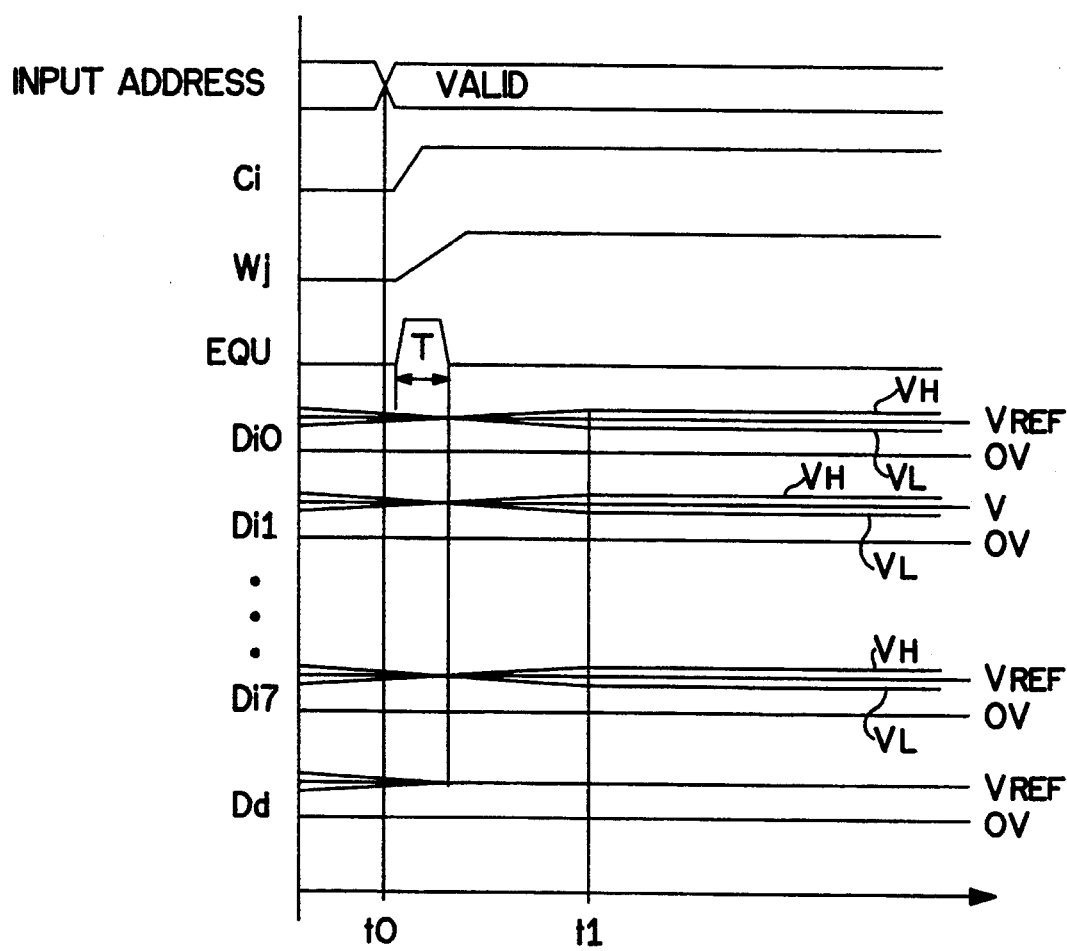
FIG. 3 is a time chart illustrating the potential transition of data lines in the embodiment of FIG. 1.

The operation of the mask ROM with the above-mentioned configuration will be described by referring FIGS. 3 and 4. As shown in FIG. 3, when the input address becomes valid at time $t_0$, in response to this, one column select line $C_i$ and one row select line $W_j$ are designated to be HIGH. Then, the transistors $Q_{ij0}-Q_{ij7}$ in memory cells 2 and the transistor $Q_{jd}$ in dummy cell 7 are respectively turned on or off in accordance with the logic state, and the respective transistors $Q_{i0}-Q_{i7}$ in the data line selection circuit 1 are turned on. The equalizing signal EQU is set HIGH for a predetermined time period T during which the transistors $Q_{E0}-Q_{E7}$ are turned on, whereby the respective data lines $D_{i0}-D_{i7}$ and the dummy data line $D_d$ are connected so as to equalize the potentials thereof.

When the equalizing signal EQU returns to LOW and the transistors $Q_{E0}-Q_{E7}$ are turned off after the time period T has been elapsed, the potentials of the transistors $Q_{i0}-Q_{i7}$ and the dummy data line $D_d$ start to change in accordance with the on/off states of the transistors $Q_{ij0}-Q_{ij7}$ and $Q_{jd}$, respectively. In other words, since the dummy cell 7 is in the logic state of "0", the potential of the dummy data line $D_d$ changes to the potential VREFat which the charge current of the transistor $Q_{Ld}$ in the load circuit 6 balances with the discharge current of the transistor $Q_{jd}$ in the on state, and then becomes valid. When the logic state of the memory cell 2 is "1", the transistors $Q_{ij0}-Q_{ij7}$ are in the off state, and therefore the potentials of the corresponding transistors $Q_{i0}-Q_{i7}$ change to the potential $V_H$ at which the corresponding transistors $Q_{Li0}-Q_{Li7}$ are turned off, and the potentials become valid. Furthermore, when the logic state of the memory cell 2 is "0", the potentials of the corresponding transistors $Q_{i0}-Q_{i7}$ change to the potential $V_L$ at which the charge currents of the corresponding transistors $Q_{Li0}-Q_{Li7}$ balance with the discharge currents of the transistors $Q_{ij0}-Q_{ij7}$ in the on state, and the potentials become valid. Since the transistor $Q_{Ld}$ of the dummy cell 7 has the doubled driving current characteristic, the order of these potentials in magnitude is as follows: the potential $V_H$, the potential $V_{REF}$ and the potential $V_L$ ($V_H > V_{REF} > V_L$).

After the potentials of the respective data lines $D_{i0}-D_{i7}$ and the dummy data line $D_d$ become valid in this way, the sense amplifier 3 compares at time $t_1$ the potential of one of the data lines $D_{i0}-D_{i7}$ selected by the switching circuit 4 with the potential of the dummy data line $D_d$, and outputs its result to the output buffer 5.

As described above, in the normal random access, an input address becomes valid at time $t_0$, whereby one column select line $C_i$ and one row select line $W_j$ are designated, and one of the data lines $D_{i0}-D_{i7}$ is selected by the switching circuit 4. Then, after time $t_1$, the logic state of the corresponding memory cell 2 can be read out. Furthermore, when accessing with another address, the logic state of the corresponding memory cell 2 can be read out after a time period ($t_1-t_0$) has been elapsed from when the input address became valid.

Figure 4:
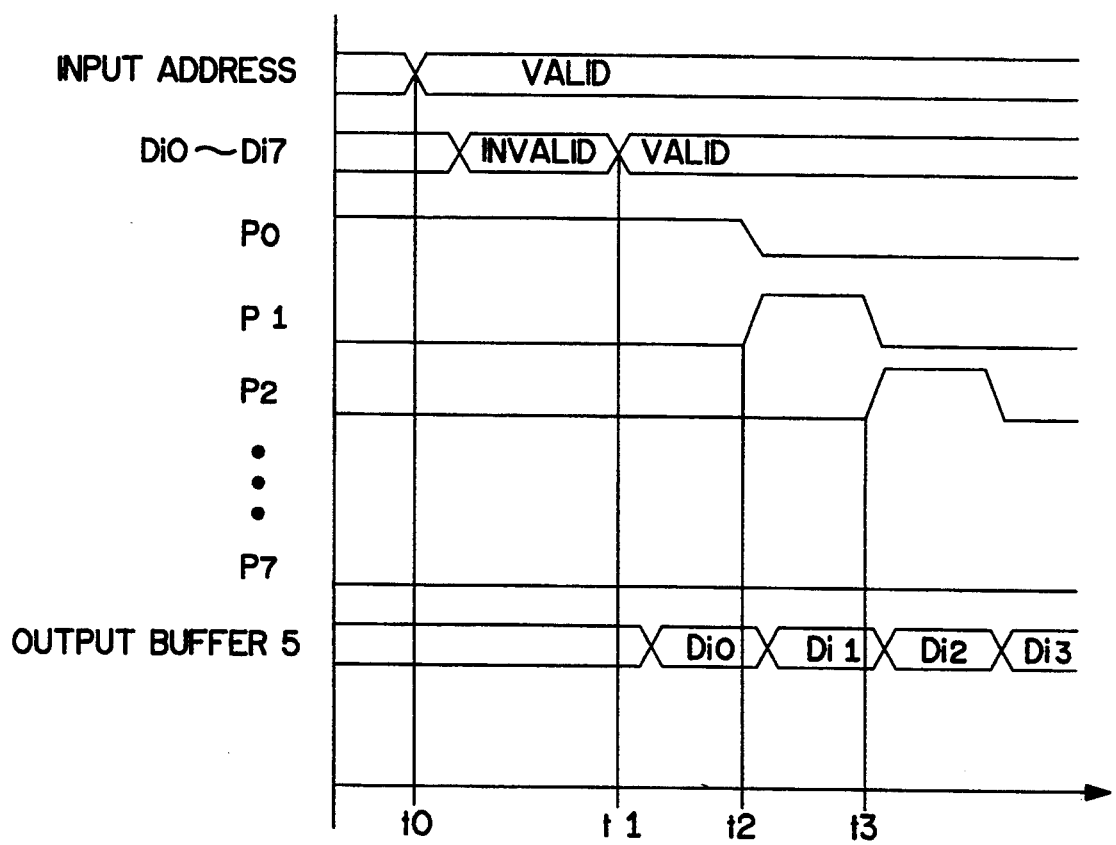
FIG. 4 is a time chart illustrating the operation of a high-speed read mode in the embodiment of FIG. 1.
Figure 5:
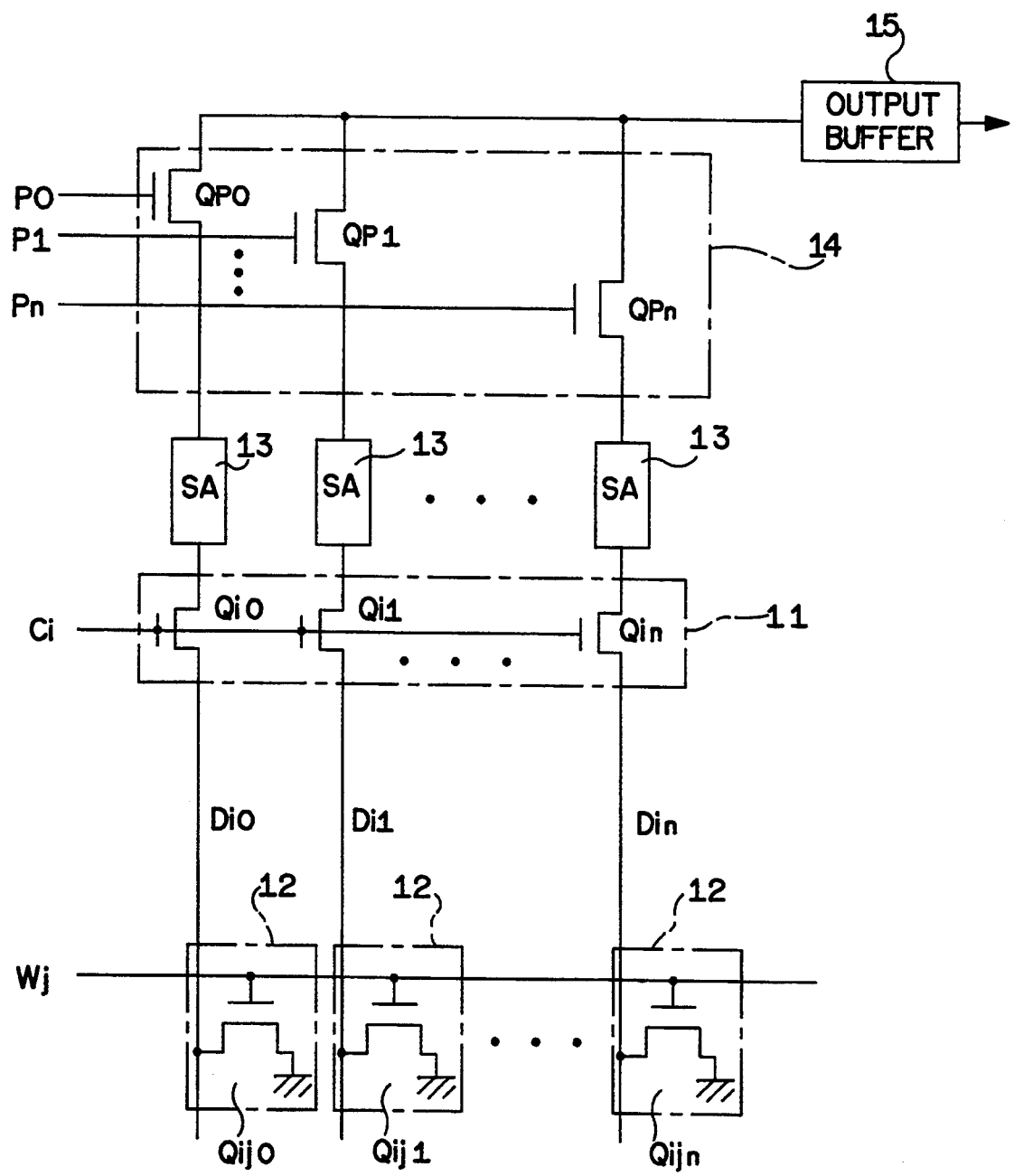
FIG. 5 is a block diagram showing the configuration of a prior art mask ROM.
Figure 6:
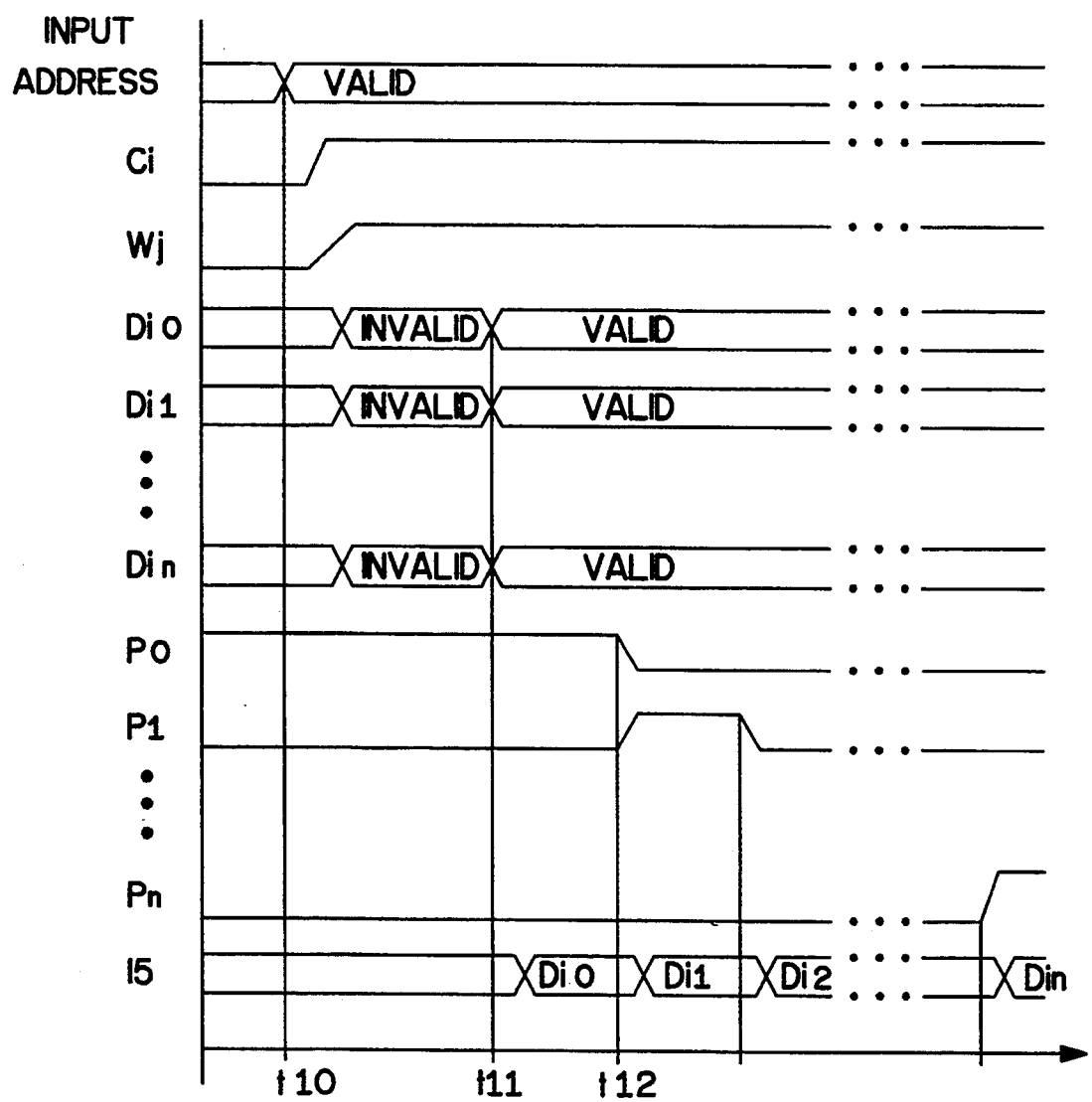
FIG. 6 is a time chart illustrating the operation of a high-speed read mode in the mask ROM of FIG. 5.

In the high-speed read mode, as shown in FIG. 4, the first read of the memory cells 2 simultaneously selected by one column select line $C_i$ and one row select line $W_j$ requires the same time period ($t_1-t_0$) as in the normal random access from time $t_0$ at which the input address becomes valid to time $t_1$ at which the potentials of the respective data lines $D_{i0}-D_{i7}$ and the dummy data line $D_d$ become valid. However, thereafter, since the potentials of the respective data lines $D_{i0}-D_{i7}$ are already valid, the other seven memory cells 2 can be read at a high speed by switching the bank select lines $P_0-P_7$ which sequentially become HIGH at time $t_2$, time $t_3$, .... The time periods between times $t_2$ and $t_3$, times $t_3$ and $t_4$, ... (i.e., time periods between the time and the succeeding time) are sufficiently shorter than the time period ($t_1-t_0$).

AS seen from above, in the mask ROM of this embodiment, in order to realize the high-speed read mode similar to the prior art, the load circuit 6 is provided with the transistors $Q_{Li0}-Q_{Li7}$ which are connected to the data lines $D_{i0}-D_{i7}$, respectively. Therefore, the required number of the sense amplifiers 3 each of which comprises a differential amplifier circuit including a number of MOSFETs and with a large power consumption can be reduced to one-eighth with respect to the prior art.

As apparent from the above description, according to the semiconductor memory device of the invention, the sense amplifier with a complicated configuration can be commonly used for a plurality of data lines only by providing simple load circuits. Therefore, the chip area and the power consumption can be reduced while the high-speed read mode is provided as in the prior art.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A semiconductor memory device comprising:
a sense amplifier;
a plurality of memory cells each for storing information;
a plurality of loads;
a plurality of data lines each having a first portion and a second portion, each of said plurality of memory cells being connected to a corresponding one of said first portions, and each of said plurality of loads being connected to a corresponding one of said second portions;
first switching means for selectively connecting any one of said plurality of second portions to an input of said amplifier; and
second switching means for simultaneously connecting said second portions to said respective first portions of said plurality of data lines to establish in cooperation with a corresponding one of said plurality of loads valid data on each of said second portions before said first switching means selectively connects any one of said plurality to second portions of said input of said amplifier.

2. A semiconductor memory device according to claim 1, wherein at least one of said plurality of loads comprise a transistor.

3. A semiconductor memory device according to claim 1, wherein said plurality of memory cells include at least one dummy memory cell.

4. A semiconductor memory device according to claim 3, wherein a dummy data line for said dummy cell is connected to one input of said sense amplifier, and said second portions of said plurality of data lines are connected to another input of said sense amplifier through said first switching means.

5. A semiconductor memory device according to claim 4, wherein equalizing means is connected between said dummy data line and said respective second portions of said plurality of data lines.

6. A semiconductor memory device according to claim 5, wherein, when said equalizing means receives a valid signal, said equalizing means connects said dummy data line with said second portions of said plurality of data lines for predetermined period of time.

7. A semiconductor memory device according to claim 1, wherein said second switching means comprises a plurality of groups of switching elements,
one of said groups of switching elements is selected from said plurality of groups of switching elements by decoding an input address, and
said selected group of switching elements simultaneously connects said first portions connected to said selected group of switching elements to said respective second portions of said plurality of data lines.

8. A semiconductor memory device comprising:
a differential sense amplifier having a first input terminal and a second input terminal;
a plurality of memory cells each for storing information;
a dummy cell for storing a standard information;
load means having a plurality of transistors;
a dummy data line having a first dummy portion and a second dummy portion, said dummy cell being connected to said first dummy portion;
a plurality of data lines each having a first portion and a second portion, each of said plurality of memory cells being connected to a corresponding one of said first portions, and each of said plurality of transistors being connected to a corresponding one of said second portions;
first switching means for selectively connecting any one of said plurality of second portions to said first input terminal of said differential sense amplifier;
second switching means for simultaneously connecting said second portions to said respective first portions of said plurality of data lines to establish in cooperation with a corresponding one of said plurality of transistors valid data on each of said second portions before said first switching means selectively connects any one of said plurality of second portions to said first input terminal of said differential sense amplifier;
third switching means for connecting said second dummy portion to said second input terminal of said differential sense amplifier; and
an equalizing means for equalizing each state of said plurality of second portions with a state of said second dummy portion;
wherein said differential sense amplifier for comparing a state of one second portion selected by said first switching means with a state of said second dummy portion.

* * * * *

UNITED STATES PATENT AND TRADEMARK OFFICE

CERTIFICATE OF CORRECTION

PATENT NO. : 5,394,371

DATED : FEBRUARY 28, 1995

INVENTOR(S) : YASUHIRO HOTTA

It is certified that error appears in the above-identified patent and that said Letters Patent is hereby corrected as shown below:

In Column 7, lines 27 and 28:
    IS:       "any one of said plurality to second portions of said input of said amplifier"

SHOULD READ:
          --any one of said plurality of second portion to said input of said amplifier--.

Signed and Sealed this

Thirteenth Day of June, 1995

Attest:

BRUCE LEHMAN

*Attesting Officer*      *Commissioner of Patents and Trademarks*